(12) United States Patent
Reiffin

(10) Patent No.: US 6,265,938 B1
(45) Date of Patent: Jul. 24, 2001

(54) LINEAR HIGH-VOLTAGE DRIVE STAGE AND CATHODE-FOLLOWER HIGH-FIDELITY POWER AMPLIFIER IMPLEMENTING SAME

(76) Inventor: Martin Reiffin, 47 Pheasant Run Ter., Danville, CA (US) 94506

( * ) Notice: Subject to any disclaimer, the term of this patent is extended or adjusted under 35 U.S.C. 154(b) by 0 days.

This patent is subject to a terminal disclaimer.

(21) Appl. No.: 09/472,424

(22) Filed: Dec. 27, 1999

(51) Int. Cl.⁷ .................................................. H03F 3/50
(52) U.S. Cl. ................................ 330/71; 330/98; 330/88; 330/119
(58) Field of Search ............................. 330/70, 71, 73, 330/74, 88, 94, 119, 122, 311

(56) References Cited

U.S. PATENT DOCUMENTS

| | | | |
|---|---|---|---|
| 2,955,261 | * 10/1960 | Edwards | 330/119 |
| 3,024,423 | * 3/1962 | Azelickis et al. | 330/71 |
| 4,647,872 | * 3/1987 | Johnson | 330/311 |
| 5,859,565 | * 1/1999 | Reiffin | 330/71 |

FOREIGN PATENT DOCUMENTS

565870  * 9/1940 (GB) ..................................... 330/71

* cited by examiner

Primary Examiner—Michael B Shingleton

(57) ABSTRACT

A novel drive stage provides with low distortion a large amplitude signal, such as required for driving a cathode-follower output stage of a power amplifier. The drive stage comprises an amplification substage and a load substage. Each substage comprises two series connected vacuum tubes. Each substage is provided with a respective voltage divider network to provide that the two tubes of each substage share approximately equally both the quiescent static voltage and the dynamic voltage of the substage. The load substage coacts with the amplification substage to provide a novel mu-follower or SRPP circuit having approximately twice the voltage swing of a conventional circuit. This approximately quadruples the maximum power output of the cathode-follower amplifier.

20 Claims, 3 Drawing Sheets

LINEAR HIGH-VOLTAGE DRIVE STAGE AND CATHODE-FOLLOWER HIGH-FIDELITY POWER AMPLIFIER IMPLEMENTING SAME

I. BACKGROUND OF THE INVENTION (1) Field of the Invention

This invention relates to a linear high-voltage amplification stage for use in, for example, high-fidelity vacuum-tube audio power amplifiers having a cathode-follower output stage requiring a large drive voltage swing.

The present invention is an improvement over that disclosed in my prior U.S. Pat. No. 5,859,565 entitled "CATHODE-FOLLOWER HIGH-FIDELITY POWER AMPLIFIER" issued Jan. 12, 1999.

(2) Description of the Prior Art

In the past decade of the art of high-end audio reproduction it has come to be recognized by many audiophiles and amplifier designers that vacuum-tube amplifiers provide superior music reproduction as compared with transistor amplifiers. These tube amplifiers generally have output stage configurations which are either push-pull or single-ended.

Both the single-ended output stage and the push-pull output stage operate in the common-cathode mode which has numerous disadvantages, primarily due to the relatively large magnitude of the tube plate resistance. As explained in more detail below, these disadvantages include the need for a large air gap in the single-ended transformer core to prevent saturation thereby reducing the transformer primary inductance and increasing the distortion due to the resulting steep elliptical loadline traversed by the tube operating point. Further, the high source impedance, inherent in the common-cathode mode, also increases the distortion due to the nonlinear magnetization current of the transformer core. It also results in a high amplifier output impedance at the speaker terminals thereby providing a low amplifier damping factor and poor speaker transient response A further disadvantage of the high source impedance of the output stage is the resulting frequency response nonlinearty when driving typical speakers which have an impedance which varies with frequency. In addition, the high source impedance of the plate resistance coacts with the leakage inductance and winding capacitance of the output transformer to generate phase shift and rolloff at high frequencies. The common-cathode mode also results in a high Miller-effect capacitance at the input of the output stage.

In a push-pull configuration, the high source impedance due to the plate resistance exacerbates the inevitable dynamic and static imbalances of a push-pull output stage accompanying the aging of the output tubes with use over time, and also those imbalances due to asymmetrical drive signals transmitted to the two halves of the push-pull stages.

These disadvantages of the common-cathode output stage are further explained in the detailed description of the prior art set forth below. It is well-known in the prior art that a lower output impedance and reduced distortion in the output stage itself can be obtained by utilizing a cathode-follower mode of operation for the output configuration. However, this has heretofore been impractical because the cathode-follower output stage requires a very large drive signal so that the preceding conventional drive stage would have generated as much or more distortion than would have been reduced by the cathode-follower output mode. Also, the large supply voltage required for the drive stage would have subjected the drive stage tube to an excessively high plate-to-cathode voltage.

My prior U.S. Pat. No. 5,859,565 implements a cathode-follower output stage to obviate the above-noted disadvantages of the common-cathode output stage, in combination with a novel drive stage to provide the required large drive signal. This novel drive stage comprises two series connected tubes which share the large static and dynamic voltages of the drive stage so as to provide with low distortion the large voltage signal required to drive the cathode-follower output stage, and without subjecting the drive stage tubes to excessively high voltages.

More particularly, the novel drive stage of my prior U.S. Pat. No. 5,859,565 comprises at least two vacuum-tube triodes connected in series with the plate of a first drive tube connected to the cathode of the second drive tube. A load impedance is connected from a B+ power supply terminal to the plate of the second drive tube. The plate of the second drive tube constitutes the output node of the drive stage and is connected to the grid of the cathode-follower output stage to drive the latter. The grid of the first drive tube constitutes the input node of the drive stage and is driven by a previous stage. The grid of the second drive tube is driven by a signal responsive voltage divider network driven by the plate of the second tube.

The voltage divider network maintains the grid of the second drive tube at a voltage approximately midway between the voltage of the second drive tube plate and the ground as said plate voltage swings in response to the signal current flowing through the load impedance. As a result, the voltage of the second drive tube cathode and the first drive tube plate is also maintained approximately midway between the voltage of the second drive tube plate and ground. That is, the two series connected drive tubes share approximately equally both the quiescent static voltage and the dynamic output voltage of the drive stage as the latter drives the grid of the cathode-follower output stage with the required large amplitude voltage swings.

As disclosed in my prior patent, the advantages of the prior invention may be best understood by first considering in more detail the problems and disadvantages of the conventional common-cathode output stage configuration of the prior art. FIG. 5 of the drawings of my prior patent shows a conventional single-ended output stage. The output tube designated OUTPUT is generally a power triode having its cathode grounded, its grid driven by a previous drive stage indicated by the voltage symbol designated DRIVE, and its plate connected to one end of the primary winding of an output transformer designated XFMR. The opposite end of the transformer primary winding is connected to a B+ power supply indicated by a voltage symbol designated SUPPLY. The transformer secondary winding is connected to the loudspeaker load designated SPKR.

This prior art single-ended output stage operates in the common-cathode mode which has numerous disadvantages. Several of these are explained with reference to FIG. 6 of the drawings of said prior U.S. Pat. No. 5,859,565 which shows a simplified equivalent circuit of the transformer at low frequencies, and with reference to FIG. 7 of that patent which shows an equivalent circuit at high frequencies. Referring first to FIG. 6, Vlf designates a low-frequency voltage source provided by an output tube (not shown). Rp represents the dynamic plate resistance of the output tube connected in the common-cathode mode. The open-circuit primary inductance of the output transformer is designated Lp. The core loss due to magnetic hysteresis and eddy currents in the transformer is designated by Zm. The loudspeaker impedance, reflected to the primary, is designated Zs. Most of the disadvantages of this common-cathode topology are due to the relatively large magnitude of the plate resistance Rp. In FIG. 7, Vhf designates a high-frequency voltage source provided by the output tube. Rp is again the plate resistance of the tube. Li symbolizes the transformer leakage inductance. Cw designates the transformer winding capacitance. Zs again refers to the reflected speaker impedance. The disadvantages arising from the high plate resistance Rp are as follows:

First, in a single-ended output stage configuration the quiescent plate-to-cathode current flows through the output transformer primary winding and is not balanced by an oppositely flowing current as in a properly biased push-pull output stage. This requires a relatively large air gap in the transformer core in order to prevent saturation of the core. The resulting increased reluctance of the core substantially reduces the transformer primary inductance which presents the output tube with a reactive low-impedance load at low frequencies. This causes the operating point of the tube to follow an elliptical loadline having a steep major axis, thereby increasing the distortion of the signal output at the plate. This distortion is exacerbated by the large plate resistance Rp because it provides a relatively high driving source impedance as seen by the primary inductance Lp. The reactive load is further disadvantageous in that at low frequencies it causes phase shift which reduces the feedback stability margin and prevents the use of substantial amounts of negative feedback, thereby further increasing the distortion of the amplifier. In a push-pull implementation the same problem exists to a lesser extent. That is, the bias currents of the output tubes eventually become unbalanced with use as the tubes age over time. This requires an air gap in the core, albeit smaller than the gap required for a single-ended topology.

Second, the high source impedance due to plate resistance Rp also increases the distortion due to the nonlinear magnetization current of the transformer core, as explained in the papers by Partridge (Ref. 1) and Hodgson (Ref. 2) in the bibliography at the end of this specification. That is, the nonlinear magnetization current results in a nonlinear voltage drop across plate resistance Rp which voltage drop, when subtracted in series from the linear source voltage Vlf, provides a nonlinear voltage to the primary winding of the transformer.

Third, the high source impedance due to the plate resistance Rp results in a high amplifier output impedance at the speaker terminals. This in turn results in a low amplifier damping factor and poor transient response, and also frequency response nonlinearity when driving typical speakers which have an impedance which varies with frequency.

Fourth, the high source impedance of the plate resistance Rp coacts with the leakage inductance Li and winding capacitance Cw to produce a high-frequency rolloff, and also to produce a phase shift at high frequencies, thereby reducing the high-frequency feedback stability margin and further limiting the amount of feedback that may be utilized to reduce distortion of the amplifier.

Fifth, the common-cathode mode results in a high input capacitance due to the Miller effect, thereby increasing the load on the previous drive stage, and also increasing the high-frequency phase shift so as to reduce further the high-frequency feedback stability margin of the amplifier.

Sixth, the high source impedance Rp exacerbates the inevitable dynamic and static imbalances of a push-pull output stage due to said aging of the output tubes with use over time, and also those imbalances due to asymmetrical drive signals transmitted to the two halves of the push-pull stages.

Several of the above-described disadvantages of the common-cathode output stage are explained in more detail at Pages 214–217 and 229–233 of the *Radiotron Designer's Handbook* (Ref. 3).

It is well-known in the prior art that a lower output impedance and reduced distortion in the output stage can be obtained with a cathode-follower configuration. That is, instead of the output transformer primary winding being connected in series between the power supply B+ terminal and the output tube plate as implemented in the usual common-cathode topology, the transformer winding is connected in series between the output cathode and the ground. Such a cathode-follower output stage is shown by Gilson and Pavlat (Ref. 4) who utilize this configuration in order to reduce the amplifier output impedance and thereby increase the amplifier damping factor for better control over the speaker cone movement. It is also well-known in the prior art that the cathode-follower mode provides low distortion when used in drive stages, as noted at Page 596 of the *Radiotron Designer's Handbook* (Ref. 3). However, for output stages the latter reference also accurately states:

"Cathode-follower output stages introduce serious problems, and are not suitable for general use, even though their low plate resistance and low distortion appear attractive. The difficulty is in the high input voltage which is beyond the capabilities of a resistance-coupled [penultimate drive] stage operating on the same plate supply voltage."

This page of the *Radiotron* reference further states that the Gilson et al. (Ref. 4) cathode-follower amplifier is seriously flawed because:

"the total harmonic distortion at 50 c/s is over 1% at 8 watts output, and 1.7% at 20 watts. The high output voltage which must be delivered by the resistance-coupled penultimate stage thus show its effect on the distortion, even though the supply voltage has been increased to a dangerously high value [700 volts]."

As stated by Crowhurst (Ref. 5):

"Full cathode-follower operation in either of the three major [output] circuits is not generally used in practice because it is as difficult to obtain (without distortion) the very large drive voltages required as to design the output stage itself with low distortion."

II. SUMMARY OF THE PRESENT INVENTION

The drive stage of the present invention is an improvement over the drive stage of said prior U.S. Pat. No. 5,859,565. The latter discloses as a preferred embodiment a passive plate load impedance in the form of a resistor extending from the power supply to the plate of the upper drive stage tube. The prior patent also suggests modifications where the drive stage is provided with an active plate load impedance. The latter consists of a single tube connected to form either a conventional mu-follower circuit or a conventional SRPP ("shunt-regulated push-pull") circuit.

The conventional mu-follower or SRPP active load circuit provides a higher plate load impedance, greater linearity, reduced distortion and lower output impedance than a passive plate load resistor (Refs. 6–9). However, the conventional active load circuit is relatively disadvantageous because its maximum static and dynamic voltages are limited by the maximum ratings of a single tube, whereas the passive load resistor is not so limited.

Instead of the single tube constituting the conventional mu-follower or SRPP load as suggested in said prior patent, the novel mu-follower or SRPP load of the present invention comprises at least two tubes connected in series so as to share the total static and dynamic voltage. As compared with the conventional active load circuits of the prior art, the present drive stage provides double the voltage swing for quadrupled power output, and greater linearity with reduced distortion for the drive stage and the amplifier as a whole. As compared with the passive plate load resistor of the prior patent, the present invention provides only moderately greater voltage swing and output power, but substantially less distortion and substantially lower output impedance.

IV. DESCRIPTION OF THE PREFERRED EMBODIMENTS

Figure 1:
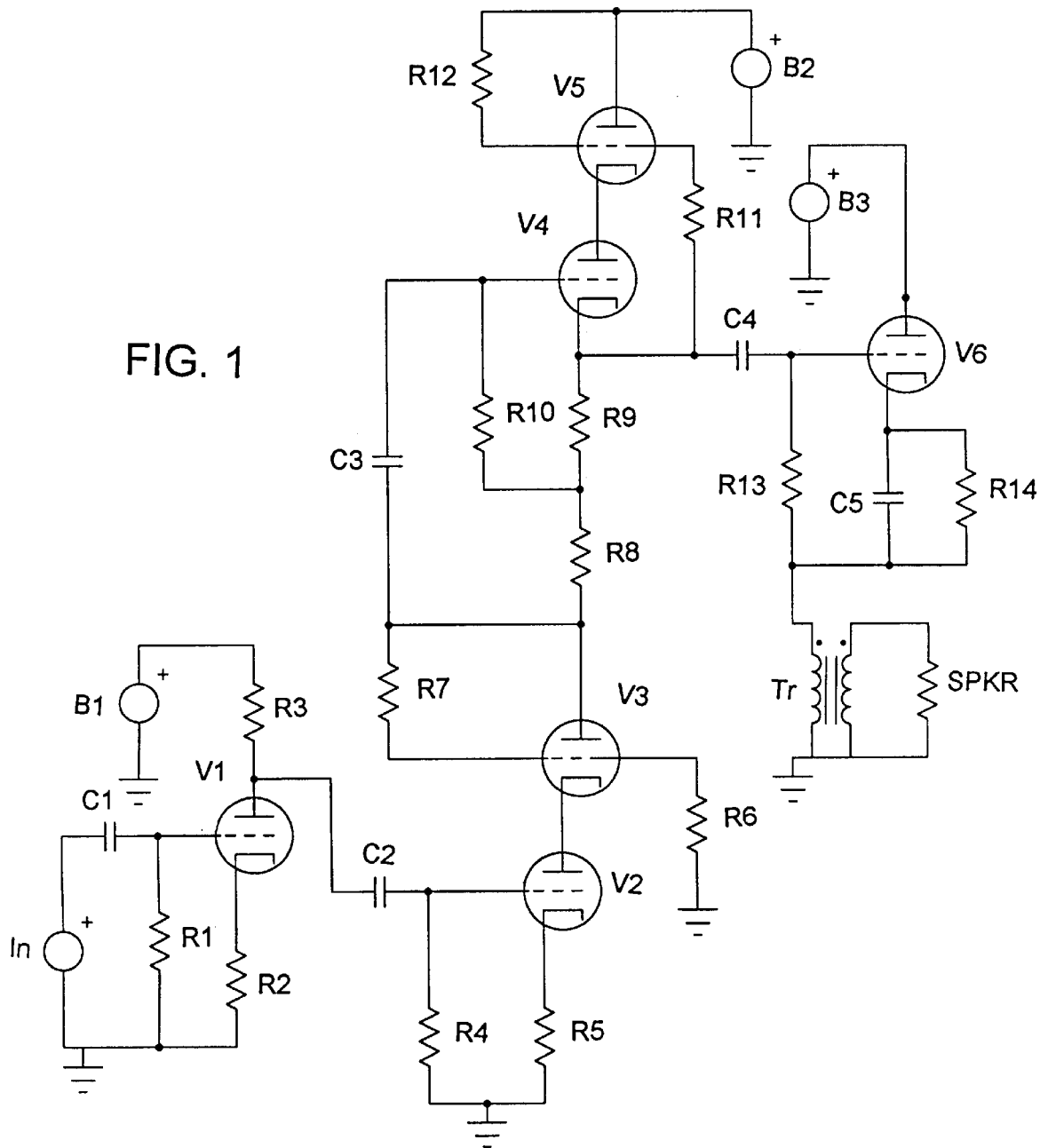
FIG. 1 is a circuit diagram showing the novel mu-follower drive stage and cathode-follower output stage of a single-ended amplifier circuit in accordance with a preferred illustrative embodiment of the present invention.

Referring first to FIG. 1, the audio input signal In is transmitted to an input stage comprising triode V1 in cascade with a novel drive stage comprising triodes V2, V3, V4, V5 for driving a single-ended cathode-follower output stage comprising a power triode V6 connected to an output transformer Tr connected to a loudspeaker SPKR. The drive stage triodes are series connected with the plate of the first drive stage triode V2 connected to the cathode of the second drive stage triode V3, the plate of the latter connected to the cathode of the third drive stage triode V4, and the plate of the latter connected to the cathode of the fourth drive stage triode V5.

The two lower drive stage triodes V2, V3 constitute an amplification substage, and the two upper drive stage triodes V4, V5 constitute an active load impedance substage. These two drive substages coact to form a novel mu-follower circuit. In a conventional mu-follower circuit each substage is implemented by a single tube. In the illustrative embodiments of the present invention each substage is implemented by a series-connected pair of tubes so as to provide that the maximum voltage swing of the drive stage is substantially doubled and thereby approximately quadrupling the maximum power output of the amplifier, while retaining the above-described advantages of a conventional mu-follower drive stage.

Describing the illustrative embodiment of FIG. 1 in more detail, the input signal designated In is connected by coupling capacitor C1 to the grid of input stage triode V1. A grid leak resistor R1 extends from the grid of V1 to ground. The cathode of V1 is connected to ground through a resistor R2. A plate load resistor R3 extends from power supply B1 to the plate of V1. The output signal from the input stage is taken from the plate of V1 and is transmitted to the drive stage by a coupling capacitor C2.

The latter is connected to the grid of the first drive stage tube V2 having both a grid leak resistor R4 and a cathode resistor R5 connected to ground. The plate of drive tube V2 is connected to the cathode of the second tube V3 of the drive stage. The grid of V3 is driven by a voltage divider network comprising resistors R6, R7. Resistor R6 extends from the grid of V3 to ground, and resistor R7 extends from the plate of V3 to the latter's grid. The resistors R6, R7 are preferably of about equal impedance, so that the respective voltages of the grid and cathode of V3 and the plate of V2 are maintained approximately midway between the overall voltage across the amplification substage from the plate of V3 to ground. The amplification substage tubes V2, V3 thereby share approximately equally the overall instantaneous voltage of the amplification substage.

The plate of V3 is connected through series resistors R8, R9 to the cathode of the lower tube V4 of the active load substage. The grid of V4 is coupled by capacitor C3 to the plate of V3. A grid leak resistor R10 extends from the grid of V4 to the junction of resistors R8, R9. The grid of V4 is thereby biased at a voltage below the voltage of its cathode by the voltage drop across resistor R9.

The plate of V4 is connected to the cathode of the upper tube V5 of the active load impedance substage. The plate of V5 is connected to a power supply B2. A voltage divider network comprising resistors R11, R12 drives the grid of V5. Resistor R11 extends from the cathode of V4 to the grid of V5, and resistor R12 extends from the grid of V5 to the plate of V5. Resistors R11, R12 are preferably of about equal impedance, so that the respective voltages of the grid and cathode of V5 and the plate of V4 are maintained approximately midway between the overall voltage across the active load substage from the plate of V5 to the cathode of V4. The active load substage tubes V4, V5 thereby share approximately equally the overall instantaneous voltage of the active load substage. The output signal of the drive stage is preferably taken from the cathode of V4 and is transmitted to the output stage by a coupling capacitor C4.

Capacitor C4 is connected to the grid of power output tube V6. The latter is preferably cathode biased by a cathode resistor R14. A grid leak resistor R13 extends from the grid of V6 to the lower end of cathode resistor R14. The grid of V6 is thereby biased at a voltage equal to the drop across resistor R14. The latter is bypassed by a capacitor C5. The plate of V6 is connected to a power supply B3.

The lower ends of resistors R13, R14 and capacitor C5 are connected to one end of the primary winding of an output transformer Tr. The other end of the primary winding is grounded. The secondary winding of output transformer Tr is connected across the amplifier load which is labeled as a loudspeaker SPKR for purposes of illustration. The power output triode V6 and output transformer Tr are thereby connected in a cathode-follower mode.

The driving source impedance at the cathode of output triode V6 is substantially lower than that at the plate of a conventional common-cathode output triode. As a result the nonlinear distortion and low-frequency phase shift are substantially reduced. The low source impedance of the cathode-follower mode substantially reduces the distortion due to the nonlinear magnetization current of the transformer core. The low source impedance results in a low amplifier output impedance at the speaker terminals. This in turn results in a high amplifier damping factor and improved transient response. The frequency response is more linear when driving typical speakers which have an impedance which varies with frequency. The low source impedance of the output triode V6 coacts with the leakage inductance Li and winding capacitance Cw to produce a rolloff at a higher frequency, and also to reduce the phase shift at high frequencies, thereby increasing the high-frequency feedback stability margin. The cathode-follower mode results in a high input impedance at the output tube grid, thereby reducing the load on the previous predrive stage, and also reducing the high-frequency phase shift so as to increase further the high-frequency feedback stability margin of the amplifier.

These advantages of the cathode-follower output configuration are made feasible by the novel drive stage V2, V3, V4, V5 which provides the large voltage drive swing required by the cathode-follower output stage, without excessive distortion in the drive stage and without excessive plate supply voltage for each drive tube. That is, by enabling a plurality of triodes to share both the quiescent voltage and the dynamic swing voltage, both the voltage swing and the quiescent plate voltage for each individual triode are reduced by about one-half. The reduced voltage swing of each triode provides for substantially reduced distortion.

Figure 2:
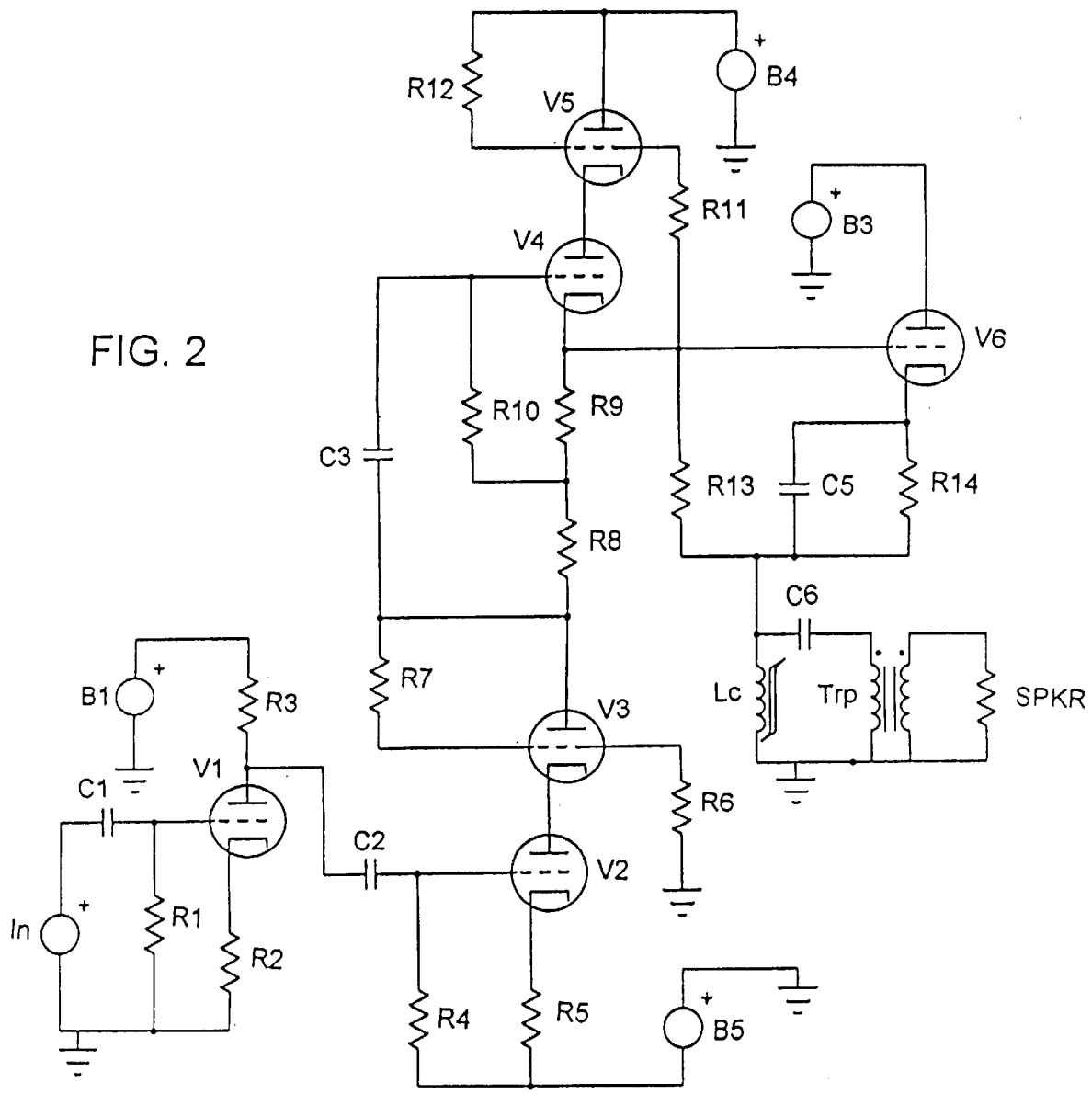
FIG. 2 is a circuit diagram showing the novel mu-follower drive stage with a split power supply, and a parallel-feed cathode-follower output stage, in accordance with another illustrative embodiment of the present invention.

Referring now to FIG. 2, there is shown another illustrative embodiment wherein the novel mu-follower drive stage is provided with a split power supply, and the cathode-follower output stage operates in a parallel-feed mode. Those parts of FIG. 2 which are the same as the corresponding parts of FIG. 1 are given the same reference numerals and will not be described again.

Instead of the single polarity power supply B2 of FIG. 1, the split power supply of the embodiment of FIG. 2 comprises a positive polarity section B4 connected to the plate of the fourth drive stage tube V5, and a negative polarity section B5 connected to the cathode of the first drive stage tube V2. This places the drive stage output node at the cathode of V4 at the same potential as the grid of the power output tube V6. As a result, the cathode of V4 may be direct-coupled to the grid of V6, thereby eliminating the coupling capacitor C4 of FIG. 1. This direct-coupling eliminates a source of phase shift, frequency rolloff and possible distortion.

The parallel-feed output stage topology of FIG. 2 comprises a choke Lc extending between the cathode circuit C5, R14 and ground, and an output coupling capacitor connecting the cathode circuit to the primary of the output transformer Trp. The quiescent DC bias current of output tube V6 flows through the choke Lc instead of through the primary of output transformer Trp. This obviates the need for an air gap in the transformer core that would otherwise be necessary to avoid saturation of the core. Elimination of the air gap reduces the reluctance of the core and increases the primary inductance of the transformer Trp, thereby obviating the low-frequency disadvantages of conventional single-ended transformers described above. The signal frequencies are conducted through coupling capacitor C6 to the transformer which is better able to handle the high-frequencies due to the reduction of leakage inductance and winding capacitance. This reduction is made possible by the smaller primary winding made feasible by the elimination of the air gap (Ref. 10).

Figure 3:
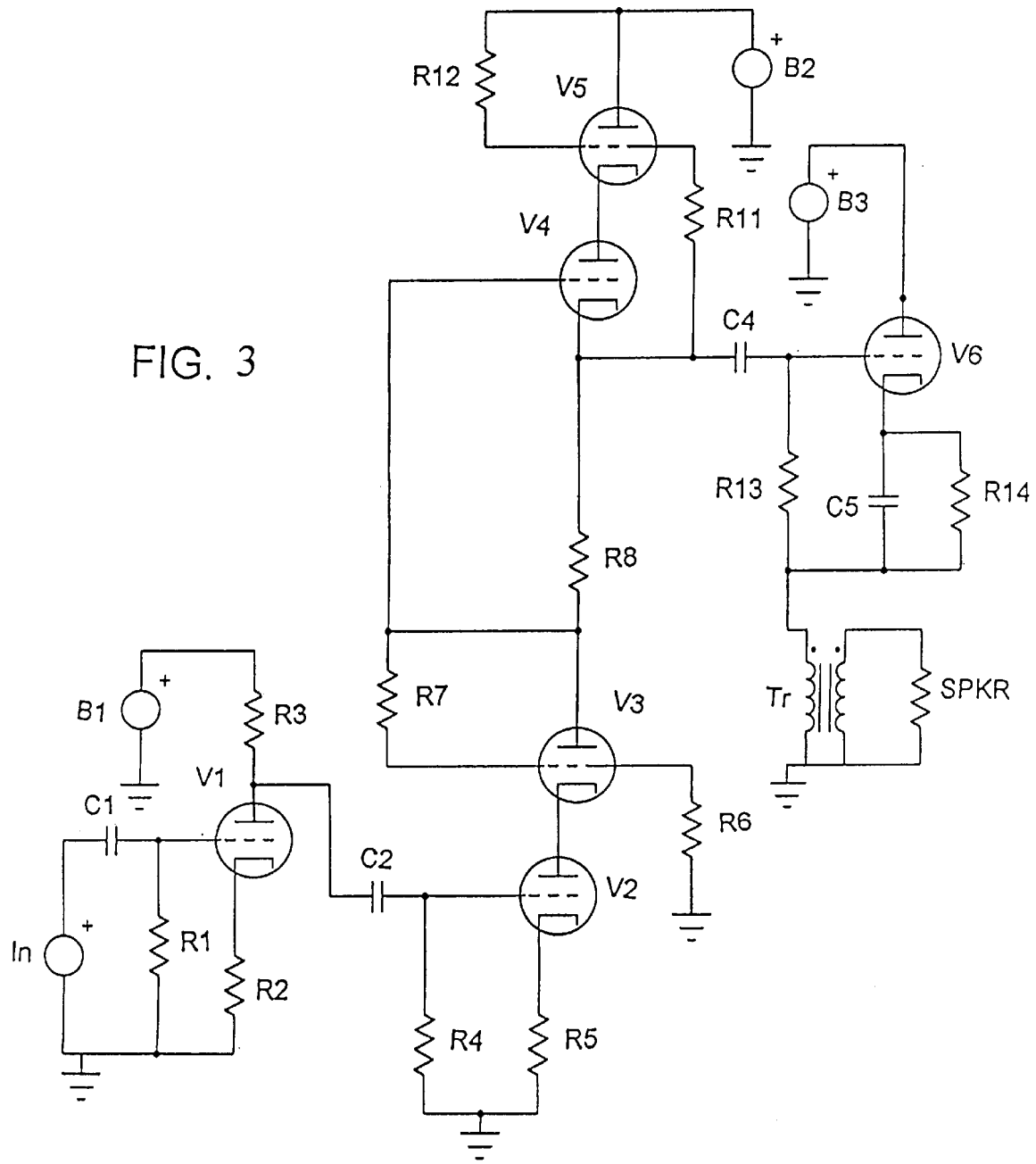
FIG. 3 is a circuit diagram showing the novel SRPP drive stage and cathode-follower output stage of a single-ended amplifier circuit in accordance with still another illustrative embodiment of the present invention.

Referring now to FIG. 3, there is shown still another illustrative embodiment comprising a novel SRPP drive stage. The latter is similar to the mu-follower stage of FIGS. 1 and 2 and differs therefrom in that capacitor C3 and resistors R9, R10 have been omitted from the mu-follower stage to form the SRPP stage of FIG. 3. The SRPP stage is not quite as effective as the mu-follower stage but is nevertheless a substantial improvement over the passive load resistor of my prior U.S. Pat. No. 5,859,565.

It should be understood that the several embodiments shown in the drawings and described in this specification are merely illustrative of several of the many forms which the invention may take in practice without departing from the scope of the invention as delineated in the appended issued patent claims which are to be construed as broadly as permitted by the prior art.

BIBLIOGRAPHY

1. Partridge, N., "Distortion in Transformer Cores", *The Wireless World*, Jun. 22, 1939, Jun. 29, 1939, Jul. 6, 1939, Jul. 13, 1939.
2. Hodgson, T., "Single-Ended Amplifiers, Feedback and Horns: Some History", *Sound Practices*, Spring 1994, Pp. 39–42.
3. Langford-Smith, F., *Radiotron Designer's Handbook*, Fourth Edition, Wireless Press, 1952, Pp. 214–217, 229–233, 596.
4. Gilson, M. D. and Pavlat, R., "A Practical Cathode-Follower Audio Amplifier", *Audio Engineering*, May 1949, Pp. 9 et seq.
5. Crowhurst, Norman H., *Understanding Hi-Fi Circuits*, Gemsback Library, 1957, P. 28.
6. Kelly, Mark, "The Search for Linearity", *Glass Audio*, Vol. 8, No. 6, 1996, P. 42; Vol. 9, No. 1, 1997, P. 32.
7. Kimmel, Alan, "The Mu Stage", *Glass Audio*, February 1993, P. 12.
8. Jones, Morgan, *Valve Amplifiers*, Newnes, 1995, Pp. 94–97.
9. Touzelet, P. J., "Theory of the SRPP Circuit", *Glass Audio*, February 1999, P.44.
10. Sanguinetti, Grego, "The B-52", *Sound Practices*, Issue 15, Winter 1997, P. 9.

I claim:

1. A vacuum tube signal amplification stage comprising
   at least two tubes each having a grid, a cathode and a plate,
   said tubes being connected in series with the plate of a first tube connected to the cathode of a second tube so that a common plate-to-cathode current flows through the tubes in series,
   a signal input node connected to the grid of said first tube,
   an active load impedance connected to the plate of said second tube, and
   a voltage divider network connecting said plate and grid of said second tube to provide that said tubes share the total voltage across both tubes.

2. An amplification stage as set forth in claim 1 and comprising
   means responsive to dynamic variations in a signal for increasing the effective magnitude of said load impedance and thereby improving the linearity of said amplification stage.

3. An amplification stage as set forth in claim 2 wherein said stage is a mu-follower.

4. An amplification stage as set forth in claim 2 wherein said stage is an SRPP.

5. An amplification stage as set forth in claim 1 wherein said active load impedance comprises
   at least a third tube having a cathode connected in series with the plate of said second tube.

6. An amplification stage as set forth in claim 1 wherein said active load impedance comprises
   at least two series-connected tubes each having a plate and a cathode, and
   a second voltage divider network to provide that said load impedance tubes share the total voltage across both of said load impedance tubes.

7. An amplification stage as set forth in claim 6 and comprising
  means responsive to dynamic variations in a signal for increasing the magnitude of said load impedance and thereby improving the linearity of said amplification stage.

8. An amplification stage as set forth in claim 7 wherein
  said first voltage divider network comprises series-connected impedances having values to maintain the voltage at the grid of said second amplification tube approximately midway between the voltage at the plate of said second amplification tube and the voltage at the cathode of said first tube,
  each of said load impedance tubes having a grid, a plate and a cathode, and
  said second voltage divider network comprises series-connected impedances having values to maintain the voltage at the grid of one of said load impedance tubes approximately midway between the voltage at the plate of said one load impedance tube and the voltage at the cathode of the other of said load impedance tubes.

9. A high-fidelity amplifier comprising
  an amplifier stage as set forth in claim 8 and having an output node,
  a cathode-follower output stage connected to said amplifier stage output node,
  an output transformer connected to said cathode-follower output stage, and
  means for connecting said output transformer to a loudspeaker system.

10. A vacuum tube signal amplification stage comprising
  at least two tubes connected in series and each tube having a grid, a cathode and a plate,
  means for transmitting an input signal to the grid of a first of said tubes,
  an active load impedance connected to the plate of a second of said tubes, and
  network means to maintain the respective plate-to-cathode voltages of said tubes approximately equal as the plate voltage of said second tube swings up and down during amplification of a signal.

11. An amplification stage as set forth in claim 10 wherein said stage is a mu-follower.

12. An amplification stage as set forth in claim 10 wherein said stage is an SRPP.

13. In combination, an amplification stage as set forth in claim 10,
  a cathode-follower output stage including at least one tube having a grid drivingly connected to said amplification stage, and
  an output transformer,
  said cathode-follower output stage tube having a cathode drivingly connected to said output transformer.

14. An amplifier stage comprising
  an amplification substage including at least two tubes connected in series to share the voltage across said amplification substage, and
  an active load impedance substage connected in series with said amplification substage.

15. An amplifier stage as set forth in claim 14 wherein
  said active load impedance substage includes at least two tubes connected in series to share the voltage across said load impedance substage.

16. A high-fidelity amplifier comprising
  an amplifier stage as set forth in claim 15 and having an output node,
  a cathode-follower output stage connected to said amplifier stage output node,
  an output transformer connected to said cathode-follower output stage, and
  means for connecting said output transformer to a loudspeaker system.

17. An amplifier stage as set forth in claim 15 and including
  circuit means to increase the magnitude of the impedance of said load impedance substage in response to a signal amplified by said amplification substage.

18. An amplifier stage as set forth in claim 17 wherein said circuit means comprises
  means for sensing the magnitude of said signal, and
  means responsive to said sensing means for driving one of said tubes of said load impedance substage.

19. An amplifier stage as set forth in claim 18 wherein
  said sensing means comprises a resistor connected in series between said substages,
  said load impedance substage includes a tube having a grid, and
  said driving means comprises a circuit element connected between said resistor and said grid.

20. A high-fidelity amplifier comprising
  an amplifier stage as set forth in claim 19,
  a cathode-follower output stage connected to said amplifier stage,
  an output transformer connected to said cathode-follower output stage, and
  means for connecting said output transformer to a loudspeaker system.

* * * * *